United States Patent
Hanya

(10) Patent No.: US 8,614,451 B2
(45) Date of Patent: Dec. 24, 2013

(54) LIGHT EMITTING DIODE DEVICE

(75) Inventor: Akihiko Hanya, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 64 days.

(21) Appl. No.: 11/229,536

(22) Filed: Sep. 20, 2005

(65) Prior Publication Data

US 2006/0065957 A1    Mar. 30, 2006

(30) Foreign Application Priority Data

Sep. 24, 2004    (JP) .................................. 2004-277764

(51) Int. Cl.
*H01L 29/22* (2006.01)
*H01L 31/0203* (2006.01)

(52) U.S. Cl.
USPC ............... 257/98; 257/99; 257/100; 257/432; 257/433; 257/436; 257/E23.066; 257/E25.032

(58) Field of Classification Search
USPC ............ 257/98–100, 676, 432–436, E23.066, 257/E25.032
See application file for complete search history.

(56) References Cited

U.S. PATENT DOCUMENTS

| | | | | |
|---|---|---|---|---|
| 5,660,461 | A | * | 8/1997 | Ignatius et al. ................ 362/241 |
| 5,998,825 | A | * | 12/1999 | Ochiai ........................... 257/311 |
| 6,066,861 | A | | 5/2000 | Hohn et al. ...................... 257/99 |
| 6,245,259 | B1 | | 6/2001 | Hohn et al. ............. 252/301.36 |
| 6,274,890 | B1 | * | 8/2001 | Oshio et al. ..................... 257/98 |
| 6,277,301 | B1 | | 8/2001 | Hohn et al. ............. 252/301.36 |
| 6,335,548 | B1 | * | 1/2002 | Roberts et al. ................... 257/98 |
| 6,576,930 | B2 | | 6/2003 | Reeh et al. ........................ 257/98 |
| 6,592,780 | B2 | | 7/2003 | Hohn et al. ............... 252/301.36 |
| 6,613,247 | B1 | | 9/2003 | Hohn et al. ............... 252/301.36 |
| 6,669,866 | B1 | | 12/2003 | Kummer et al. ........ 252/301.4 R |
| 6,774,401 | B2 | | 8/2004 | Nakada et al. ................... 257/82 |
| 6,809,342 | B2 | | 10/2004 | Harada ........................... 257/79 |
| 6,812,500 | B2 | | 11/2004 | Reeh et al. ....................... 257/98 |

(Continued)

FOREIGN PATENT DOCUMENTS

| | | |
|---|---|---|
| CN | 1510766 | 7/2004 |
| JP | 10-173242 | 6/1998 |

(Continued)

OTHER PUBLICATIONS

Office Action from Chinese Patent App. No. 2005101053577 (Jun. 6, 2008).

*Primary Examiner* — Nitin Parekh
(74) *Attorney, Agent, or Firm* — Kenealy Vaidya LLP

(57) ABSTRACT

A plurality of separate lead frames can be insert-molded in a reflector composed of a white resin having a high reflectivity to form a package for an LED device. A cavity is formed in the reflector. The cavity can have an inner circumferential surface that opens wider in an upward direction. Cups can be located in the cavity. Each cup has an outer wall that can be in the form of a cylinder with the bottom formed of each of two separate lead frames. A red LED chip and a green LED chip can be adhesively fixed to the lead frames located on the bottoms of the respective cups. The LED chips can have lower electrodes, which are electrically brought into conduction with the lead frames one by one. The LED chips can also have upper electrodes, which are electrically brought into conduction with the lead frames one by one via bonding wires. A light transmissive resin can be filled in the cavity.

22 Claims, 5 Drawing Sheets

(56) References Cited

U.S. PATENT DOCUMENTS

| | | |
|---|---|---|
| 7,126,162 B2 | 10/2006 | Reeh et al. |
| 7,151,283 B2 | 12/2006 | Reeh et al. |
| 7,230,280 B2 * | 6/2007 | Yaw et al. ................. 257/98 |
| 7,253,448 B2 * | 8/2007 | Roberts et al. ............. 257/99 |
| 7,276,736 B2 | 10/2007 | Hohn et al. |
| 7,281,818 B2 * | 10/2007 | You et al. ................. 362/241 |

FOREIGN PATENT DOCUMENTS

| | | |
|---|---|---|
| JP | 10-190065 | 7/1998 |
| JP | 2001-127346 | 5/2001 |
| JP | 2001-196639 | 7/2001 |
| JP | 2001-210872 | 8/2001 |
| JP | 2001-345483 | 12/2001 |
| JP | 2004-056075 | 2/2004 |

* cited by examiner (a)

(b)

(a)

(b)

LIGHT EMITTING DIODE DEVICE

This application claims the priority benefit under 35 U.S.C. §119 of Japanese Patent Application No. 2004-277764 filed on Sep. 24, 2004, which is hereby incorporated in its entirety by reference.

BACKGROUND OF THE INVENTION

1. Field of the Invention

The invention relates to a light emitting diode (LED) device. More particularly, it relates to an LED device including LED chips of two or more types having different light source colors that are combined as light sources to provide a light of a desired tone by mixing the light emitted from the various LED chips.

2. Description of the Related Art

A spectrum of light emitted from an LED chip has a sharp rise and fall, which provides a light source color of a tone approximately corresponding to a peak emission wavelength in a spectral distribution. An LED light source having such an optical property may be employed in a method to provide a light of a tone different from the light source color. In this method, LED chips of two or more types having different light source colors are generally combined to provide a light of a desired tone by mixing light emitted from the LED chips.

An example of the above-described related art LED device is shown in FIG. 9. This is also referred to as a shell type LED device, in which three lead frames 51R, 51G, 51B having recessed tips formed as cups with reflecting inner circumferential surfaces, and three lead frames 52R, 52G, 52B having flat tips, are arranged in parallel, leaving a certain interval therebetween.

On the bottoms of the cups in the three lead frames 51R, 51G, 51B, a red LED chip 53R, a green LED chip 53G and a blue LED chip 53B having light source colors of red, green and blue are mounted. The red LED chip 53R has a lower electrode, which is electrically brought into conduction with the lead frame 51R for receiving the red LED chip 53R mounted thereon. The red LED chip 53R has an upper electrode, which is connected via a bonding wire with the tip of the flat tip lead frame 52R to be electrically in conduction therewith.

Of the pair of electrodes formed on each of the green LED chip 53G and the blue LED chip 53B, one is connected via a bonding wire with the lead frame 51G and 51B, respectively, for receiving the corresponding LED chip mounted thereon, and electrically brought into conduction therewith. The other of the pair of electrodes formed on each of the green LED chip 53G and the blue LED chip 53B is connected via a bonding wire with the tip of the flat tip lead frame 52G and 52B, respectively, and electrically brought into conduction therewith.

The tips of all the lead frames 51R, 51G, 51B, 52R, 52G, 52B are sealed in a light transmissive resin, and the red LED chip 53R, the green LED chip 53G, the blue LED chip 53B and the bonding wires are protected with the sealed resin 54. The light exit surface of the sealing resin 54 is formed with three semispheroidal convex lenses 55 having optical axes substantially coincident with those of the red LED chip 53R, the green LED chip 53G and the blue LED chip 53B.

Each of the red, green and blue light emitted from respective LED chips is partly guided in the light transmissive resin of the sealed resin to directly travel toward a respective semispheroidal convex lens on the light exit surface. On the other hand, each light is partly reflected at a respective inner circumferential surface of the cups in the lead frame, and the reflected light is guided in the light transmissive resin to travel toward a respective convex lens. When the light reaches the convex lens after passing through these two optical paths, the light is distributed to achieve certain directivity through the convex lenses on the light exit surface and is externally emitted (emitted into the atmosphere).

The red light, the green light and the blue light, or the three primary colors of light, emitted from the light exit surfaces of the respective convex lenses are mixed to form a white light. Mixing the light emitted from the respective red LED chip, green LED chip and blue LED chip while selectively controlling (including blinking) the amounts thereof can yield a light of substantially all colors including the light source colors of the respective LED chips and white light (see Patent Document 1: JP-A 10-173242, for example).

As desire for downsizing and thinning electronic instruments and lowering prices thereof has proceeded in recent years, similar requirements/characteristics are desired for the electronic components and mounting boards contained in the electronic instruments. Therefore, a printed wire board for use in an electronic components mounting board is designed as a single-sided board having printed wire patterns formed only on one surface of the printed wire board to arrange mounted components intensively on one surface. Electronic components of the surface-mount type are mounted on the same surface of the single-sided board on which the wire patterns are formed to achieve a lowered height and a lowered cost of the electronic components mounting board.

However, the above-described related art LED device can not typically be mounted on the same surface of a single-sided board on which surface-mount electronic components are mounted. Therefore, mounting these related art LED device on the printed wire board, mixed with the surface-mount electronic components, often requires the use of a double-sided board having wire patterns formed on both surfaces of a printed wire board. In this case, the LED device is mounted on the surface of the double-sided board opposite to the surface on which the surface-mount electronic components are mounted.

Accordingly, the height of the electronic components mounting board is increased and the cost of the printed wire board is elevated, which in turn elevates the cost of the electronic components mounting board and electronic instrument itself. This result runs counter to the above-described desire for a less expensive, thinner electronic component.

To achieve a certain amount of downsizing and/or thinning of the electronic instrument as well as lowering costs/prices thereof, surface-mount LED devices shown in FIGS. 10 and 11 which have the optical action similar to that of the related art shell type LED device can generally be employed.

In the surface-mount LED device of the related art shown in FIG. 10, LED chips 61 are mounted in a plurality of recessed cups 62 formed in a lead frame 63 that is insert-molded in a white resin that has high reflectivity. Above the cups, a cavity 66 having an inner circumferential surface that is open wider at an upward location is formed in a reflector 64 to configure a package.

An LED chip 61 is fixed in each cup 62 via a conductive member (not shown). The LED chip 61 has a lower electrode, which is electrically brought into conduction with the lead frame 63. The LED chip 61 has an upper electrode, which is connected and electrically brought into conduction via a bonding wire 65 with a lead frame 63' separated from the lead frame 63.

A light transmissive resin 67 is filled in the cavity 66 and in a space between the cup 62 and the LED chip 61 to protect the LED chip 61 and the bonding wire 65 with the sealed resin. At the same time, convex lenses 68 having optical axes substantially coincident with those of the LED chips 61 are formed on the light exit surface of the sealed resin.

The other surface-mount LED device of the related art shown in FIG. 11 is configured without the white resin located below the lead frame 63 from the LED device shown in FIG. 10. In a word, the part above the lead frame 63 has the same configuration and the same optical action as that of the LED device shown in FIG. 10.

The lead frame for use in the above-described surface-mount LED device is produced through pressing a flat metal plate using a press mold. At that time, the mold structurally determines the shortest interval between adjacent cups based on the thickness of the lead frame. Therefore, the shortest distance between adjacent LED chips mounted on the cups is limited as determined by the thickness of the lead frame.

In such a case, when plural LED chips having different light source colors are mounted in respective cups to mix the light that is emitted from the LED chips, the LED chips may not be located sufficiently close to each other for a particular purpose or application. As a result, the LED device may result in an insufficient light mixture and/or a deteriorated color mixture, etc.

A constraint on the interval between the cups also exerts an influence on the ability to downsize the LED device, often resulting in insufficient downsizing.

The lead frame is produced through pressing of a flat metal plate. Accordingly, physical properties such as the hardness of the metal plate and characteristics such as the thickness add constraints to the shape of the lead frame, such as the inner diameter and depth of the cup. Therefore, the flexibility of the optical design associated with the LED device is limited, and the optically and structurally ideal best product can not be made.

It is difficult work to form the cup integrally with the circuit pattern composed of the flat metal plate such that it has an extremely narrow width. In this case, elevation of the mold production cost due to the complicated press mold and insufficient dimension accuracy may invite elevation of the production cost and deterioration of quality.

SUMMARY OF THE INVENTION

The invention has been devised in consideration of the above and other problems, challenges, and desires, and can provide an LED device with excellent color mixture, excellent efficiency of external light extraction/emission (to the atmosphere), high light intensity, and/or with the possibility of downsizing.

In a first aspect of the invention, an LED device can include a reflector molded of a resinous material, the reflector including a cavity formed of the resinous material integrally with the reflector. A plurality of cups can be formed of the resinous material in the cavity, a lead frame can be insert-molded, and a plurality of LED chips can be individually disposed in the plurality of cups. A light transmissive resin can be filled in the cavity to seal the plurality of LED chips and the plurality of cups.

In a second aspect of the invention, the cups for receiving the LED chips disposed therein can be shaped to be substantially cylindrical.

In a third aspect of the invention, the resinous material can include a white resin having a high reflectivity.

In a fourth aspect of the invention, the LED chips can include a combination of LED chips of two or more types having different light source colors.

In a fifth aspect of the invention, the LED device can further include convex lenses having optical axes substantially coincident with those of the LED chips and formed above the LED chips.

In an exemplary LED device made in accordance with the principles of the invention, the cups are formed of the same resin as that for forming the reflector, integrally with the reflector, inside the cavity formed in the reflector. The LED chips having different light source colors are mounted in respective cups. This is effective to confine the light emitted from each of the LED chips in a narrow space such that each of the different lights reaches the convex lenses on the light exit surface before they substantially diffuse.

Therefore, when the light reaches the convex lens, it exists within a narrow zone. Accordingly, relatively mild light condensation can efficiently condense the light to be externally emitted. Thus, even a convex lens having a small curvature is possible to sufficiently exert a light condensing effect and realize a low-height LED device.

As the distance between adjacent cups can be made shorter as compared to the related art, it is possible to downsize the LED device and contribute to downsizing the instrument that includes the LED device mounted thereon.

Similarly, as the distance between adjacent cups can be shortened, even if the LED chips having different light source colors are used to configure particular types of light sources, light emitted from the LED chips can be mixed well. This is advantageous to provide an LED device that has excellent color mixture characteristics.

The shape of the convex lens formed above the LED chip can be controlled to freely set the degree of condensing the light that is emitted from the exit surface of the lens. This means that the distribution of light emitted from the LED device can be freely controlled.

The outer wall defining the cup can be formed on molding, etc. Therefore, application of a process to the mold makes it possible to freely set the shape of the cup without any constraint. Accordingly, the flexibility in determining the light distribution by the shape of the cup is large, and the distribution of light that is emitted from the LED chip and which reaches the convex lens can be realized in an ideal form.

As a result, it is possible to realize an optimal light distribution in consideration of conditions and environments for the use of the LED device, such as the distance and direction associated with observation of the LED device and the shape and size of an object illuminated by the LED device.

DETAILED DESCRIPTION OF EMBODIMENTS OF THE INVENTION

Figure 1:
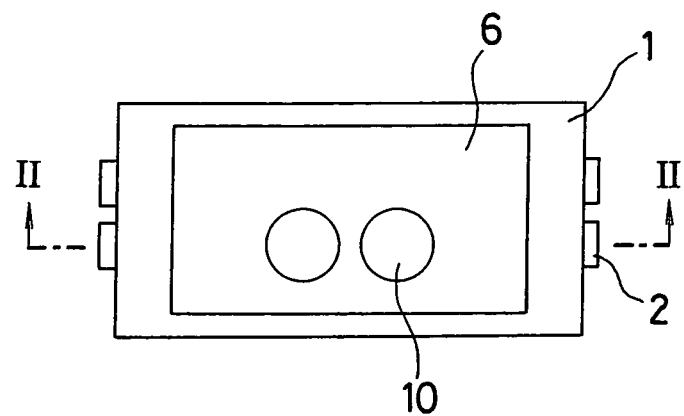
FIG. 1 is a top view illustrative of an embodiment of an LED device made in accordance with the principles of the invention.

Various exemplary embodiments of this invention will now be described with reference to FIGS. 1-8 in detail (using the same reference numerals to denote the same or similar parts). The embodiments described below are examples of the invention and are given various technical features. However, the scope of the invention is not limited to these embodiments.

Figure 2:
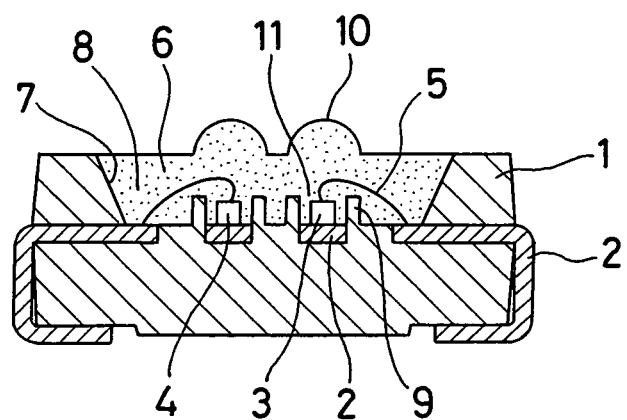
FIG. 2 is a cross-sectional view along line 11-11 of FIG. 1.

FIG. 1 is a top view illustrative of an embodiment of an LED device made in accordance with the principles of the invention. FIG. 2 is a cross-sectional view taken along line II-II of FIG. 1. This embodiment is directed to an LED device of the so-called surface-mount type, which includes a reflector 1, a lead frame 2, a red LED chip 3, a green LED chip 4, a bonding wire 5, and a light transmissive resin 6.

The LED device including these elements can also include the following structure. Plural separate lead frames 2 can be insert-molded in the reflector 1 composed of a white resin having high reflectivity to form a package for the surface-mount LED device. A cavity 8 can be formed in the reflector 1 and have an inner circumferential surface 7 that is open wider at an upward location. Cups 11 can be formed in the cavity 8 and can each have an outer wall 9 in the form of a cylinder with the bottom formed of separate lead frames 2.

The red LED chip 3 and the green LED chip 4 can be adhesively fixed via a conductive member (not shown) to the lead frames 2 located on the bottoms in the cylindrical outer walls 9. The LED chips 3 and 4 can have respective lower electrodes, which are electrically brought into conduction with the lead frames 2 one by one.

On the other hand, the red LED chip 3 and the green LED chip 4 can have respective upper electrodes, which are electrically brought into conduction with the lead frames 2 one by one via bonding wires 5.

A light transmissive resin 6 can be filled in the cavity 8 to protect the red LED chip 3, the green LED chip 4 and the bonding wires 5. At the same time, two convex lenses 10 having optical axes substantially coincident with respective optical axes of the LED chips 3 and 4 can be formed on the light exit surface of the sealed resin.

The LED device having such a structure can include the following optical system. The red and green light emitted from the LED chips 3 and 4 can be partly guided in the light transmissive resin 6 to directly travel toward respective convex lenses 10 located on the light exit surface. The light can also be partly reflected from the inner circumferential surface 7 of the cavity 8. The reflected light is then guided in the light transmissive resin 6 to travel toward the convex lenses 10. When the light reaches its respective convex lens 10 after passing through these two optical paths, the light can be distributed to achieve certain directivity through the convex lenses 10 and externally emitted (into the atmosphere).

In this case, the light emitted from the LED chips 3 and 4 is mostly confined in the narrow cups 11 surrounded by the respective cylindrical outer walls 9. The light confined in the narrow zones reaches a respective convex lens 10 located on the light exit surface before the light largely diffuses.

As a result, most of the light emitted from the LED chips 3 and 4 can reach the convex lenses 10 directly, and the light is distributed such that it achieves certain directivity through the convex lenses 10 and is externally emitted. Therefore, it is possible to realize an LED device with excellent efficiency of external light extraction, as well as high light intensity, with respect to the light emitted from the LED chips.

Figure 3:
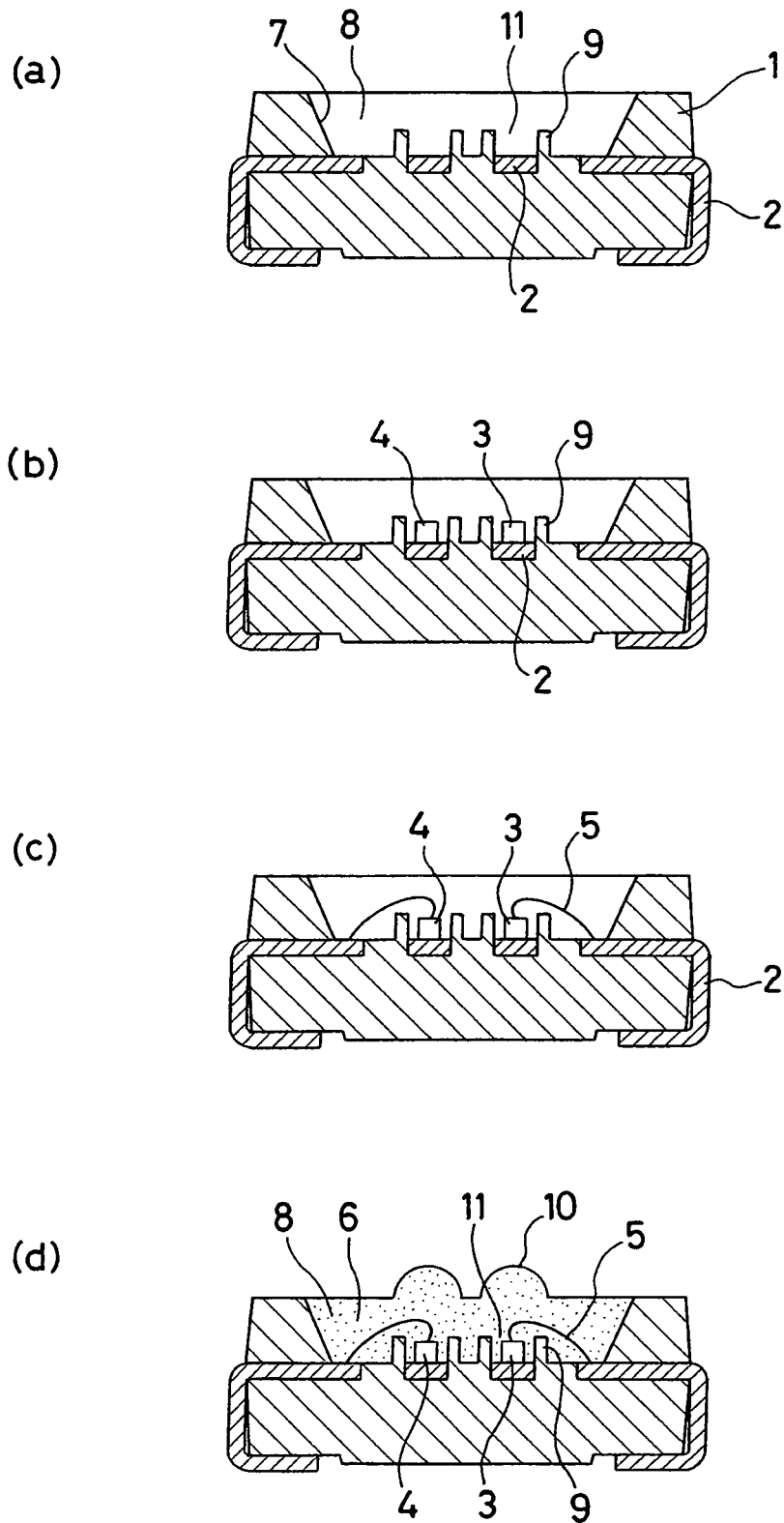
FIGS. 3(a)-(d) show process diagrams associated with the LED device of FIG. 1.

FIG. 3 shows process diagrams illustrative of production processes of the embodiment of FIG. 1. In this example, a flat metal plate is pressed with a press mold to prepare the lead frame and, as shown in FIG. 3(a), the lead frame 2 is insert-molded in the reflector 1 to form the package for the LED device. The reflector 1 can be composed of white resin having high reflectivity. At the same time, the cavity 8 having an inner circumferential surface 7 that is open wider at an upward location along an optical axis in the light emitting direction of the device as compared to a downward direction is formed in the reflector 1. In addition, cups 11 each having a cylindrical outer wall 9 with the bottom formed of the lead frame 2 can be formed in the cavity 8.

Next, as shown in FIG. 3(b), the red LED chip 3 and the green LED chip 4 can be adhesively fixed via a conductive member (not shown) onto the lead frames 2 located on the bottoms in the cylindrical outer walls 9. The lower electrodes of the LED chips 3 and 4 can be brought into electrical connection (conduction) with the lead frames 2 one by one.

Then, as shown in FIG. 3(c), the bonding wires 5, connected at one end to the upper electrodes of the red LED chip 3 and the green LED chip 4, can be connected at their other end to the lead frame 2. The upper electrodes of the LED chips 3 and 4 can be brought into electrical conduction with the lead frames 2 one by one.

Further, as shown in FIG. 3(d), the light transmissive resin 6 can be filled in the cavity 8 and in the cups 11 surrounded by the cylindrical outer walls 9 to seal the LED chips 3 and 4 and the bonding wires 5. At the same time, two convex lenses 10 having optical axes substantially coincident with respective optical axes of the LED chips 3 and 4 can be formed on the light exit surface of the sealed resin.

Figure 4:
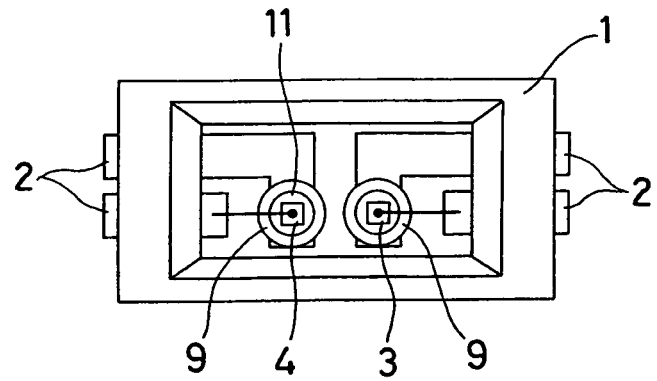
FIG. 4 is a top view illustrative of a state during production of the embodiment of the LED device shown in FIG. 1.

FIG. 4 is a top view of FIG. 3(c) illustrative of a state immediately before filling the light transmissive resin in the cavity in the step of producing the LED device of the embodiment of FIG. 1. The red LED chip 3 and the green LED chip 4 can be mounted in respective cups 11 surrounded by the cylindrical outer walls 9. The lead frames 2 brought into conduction with the upper and lower electrodes of the LED chips 3 and 4 can lead externally outward through the reflector.

Figure 5:
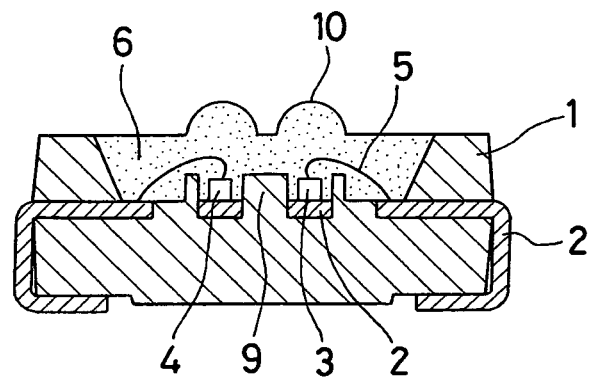
FIG. 5 is a cross-sectional side view illustrative of another embodiment of an LED device made in accordance with the principles of the invention.
Figure 6:
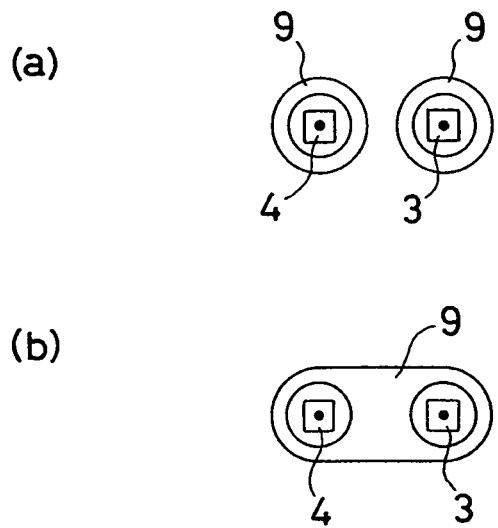
FIG. 6 shows (A) a partial top view illustrative of an outer wall of the embodiment of the LED device shown in FIG. 1, and (B) a partial top view illustrative of an outer wall of the embodiment of the LED device shown in FIG. 5.
Figure 7:
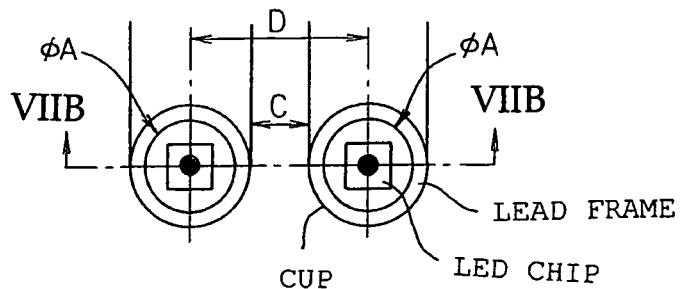
FIG. 7 shows (A) a partial top view illustrative of cups formed in a lead frame of an LED device of the related art, and (B) a cross-sectional view along line VIIB-VIIB of FIG. 7(A)
Figure 7:
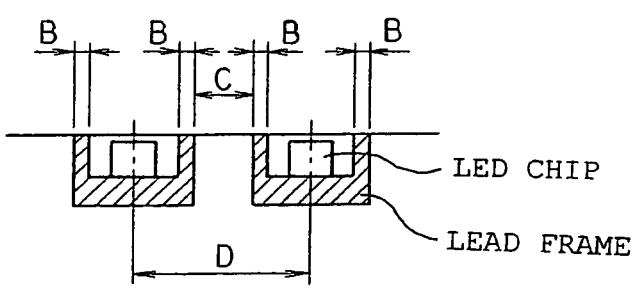
Figure 8:
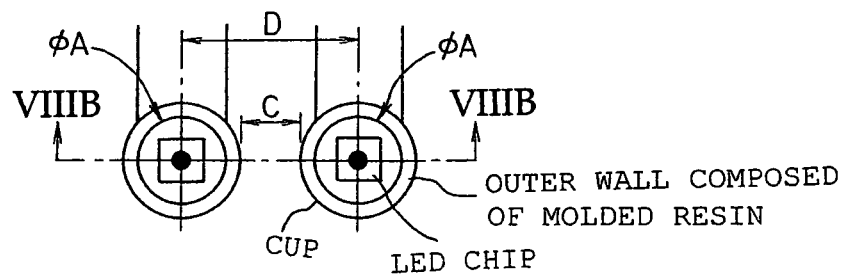
FIG. 8 shows (A) a partial top view illustrative of an outer wall of the embodiment of the LED device shown in FIG. 1, and (B) a cross-sectional view along line VIIIB-VIIIB of FIG. 8 (A)
Figure 8:
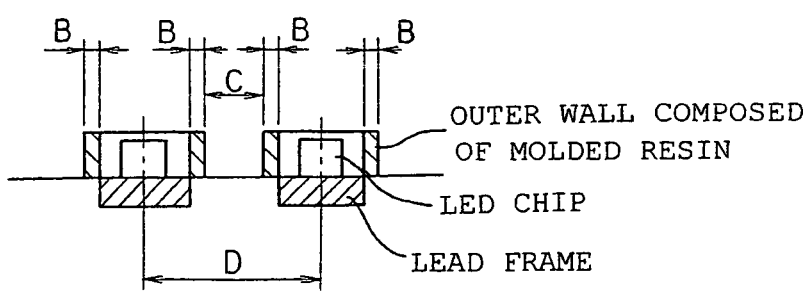
Figure 9:
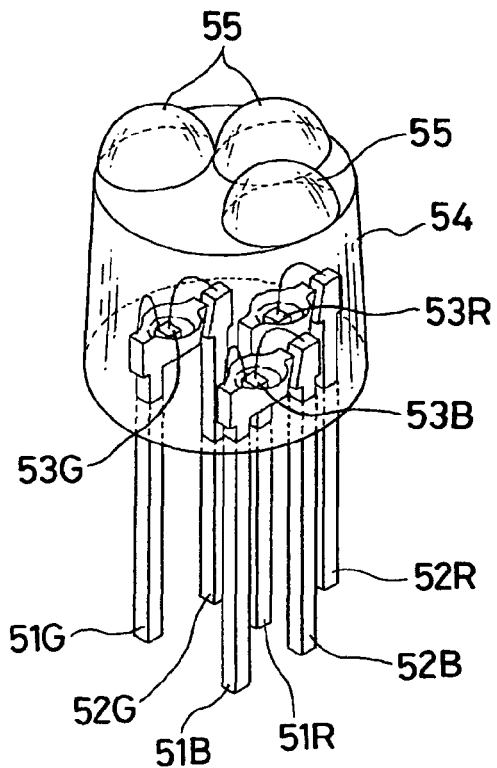
FIG. 9 is a perspective view illustrative of an LED device of the related art.
Figure 10:
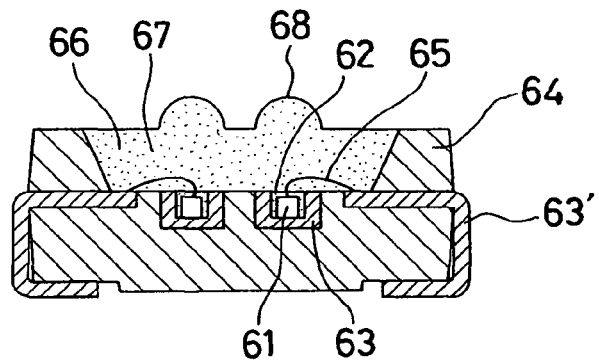
FIG. 10 is a cross-sectional view illustrative of another LED device of the related art.
Figure 11:
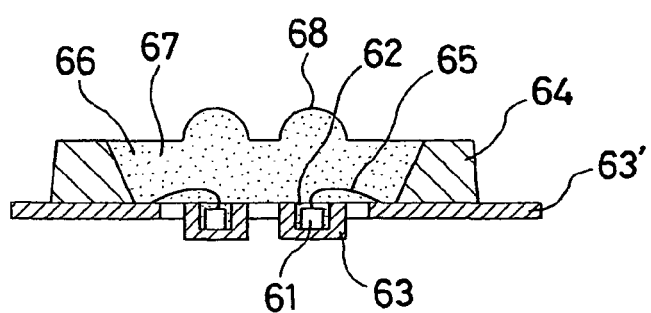
FIG. 11 is a cross-sectional view illustrative of yet another LED device of the related art.

The shape of the outer wall of the cup formed of the molded resin can be considered in various ways, for example, one as shown in FIG. 5 as another embodiment. In this embodiment, the outer walls 9 for surrounding the red LED chip 3 and the green LED chip 4 are formed integrally. Other structural parts can be substantially or totally the same as those in the embodiment of FIG. 1. The shape of the outer wall 9 is not limited to those of FIGS. 6(A)-(B) and can be square, rectangular, triangular, non-symmetrical, wavy, etc. Rather, there is no limit for the shape if the LED chips 3 and 4 can be totally or partially surrounded separately, and the distance between the LED chips 3 and 4 can be desirably set, and so long as the LED device can be downsized, if desired, without any trouble.

The mounting structure for the red LED chip 3 and the green LED chip 4 is described in this embodiment though the number of the LED chips to be mounted is not limited to two.

Rather, on the basis of the fundamental structure of this embodiment, mounting structures for three or more LED chips of any selected light source colors are also possible. Therefore, the number of the cups formed by the outer walls is not limited to two but may be three or more without any problem and without departing from the scope of the invention. In this case, mixing light emitted from the LED chips while selectively controlling (including blinking) the amounts thereof can yield a light of substantially all colors including the light source colors of the LED chips and white light.

For the surface-mount LED device including the LED chips mounted in the package with the lead frame insert-molded in the reflector, the cups for surrounding the LED chips can be formed using some of the principles of the method of the related art shown in FIGS. 7(A)-(B) as well as through an exemplary forming method in accordance with the principles of the invention shown in FIGS. 8(A)-(B). The method of the related art includes previously forming cups in or on the lead frame before insert-molding the lead frame. A method in accordance with the principles of the invention can include insert-molding the flat lead frame in a resin and simultaneously forming the cups with the molded resin.

As for the dimensions of the cups, both methods are compared as follows. When adjacent cups have an inner diameter A and a thickness B, and a distance between the cups is equal to C and a distance between the centers of the cups (a distance between LED chips when the LED chips are mounted) is equal to D, the distance D between adjacent LED chips can be represented by the equation: $D=A+(B\times 2)+C$.

In this case, among the conditions associated with the dimensions A, B and C, both methods can realize A and B in any desired dimensions. As for the dimension of C, however, the method of forming the cups in the lead frame of the related art, it is equal to the lead frame thickness$\times$(0.8 or more). To the contrary, in a method of forming the cups with the molded resin in accordance with the principles of the invention, the dimension C can be equal to the lead frame thickness$\times$(0.8 or more)$-(B\times 2)$.

In a comparison of the shortest distance D between adjacent LED chips that can satisfy this condition, $D=A+(B\times 2)+$ the lead frame thickness$\times 0.8$ in the method of the related art while $D=A+$the lead frame thickness$\times 0.8$ in the above-described exemplary method in accordance with the principles of the invention.

Therefore, the above-described method in accordance with the principles of the invention makes it possible to form the cups to mount adjacent LED chips at an interval as close as $(B\times 2)$, that is, a distance twice the thickness of the cup.

If only an improvement in color mixture of lights emitted from the LED chips is desired, it is not always required to form the lenses in accordance with the above described embodiment. In this case, a shortened distance between LED chips might exert a sufficient effect.

Effects associated with an embodiment of the LED device made in accordance with the principles of the invention will be described. The use of the LED device is roughly divided into the use for illumination and the use for display. Requirements sought in the use for illumination include excellent brightness and color rendering (fidelity of color). On the other hand, the use for display requires uniformity and reproducibility of tone.

The LED device including plural LED chips having different light source colors used as light sources can be employed for both light source and display element purposes. When it is employed in a relatively small instrument, downsizing is one of the important requirements.

The LED device of the above-described embodiment can include plural LED chips having different light source colors and can include the cavity having the inner circumferential surface that is open wider at an upward location. In the cavity, cups surrounded by two cylindrical outer walls can be formed. In the cups, the LED chips can be mounted. Thus, the light emitted from the LED chips and confined in the narrow zones in the cups reaches the lenses on the light exit surface before the light diffuses wider to surrounding areas.

Therefore, when the light reaches the respective lenses formed above the LED chips, the light exists in narrow zones. Accordingly, relatively mild light condensation can efficiently condense the light that is to be externally emitted. Thus, even a small-curvature convex lens is possible and can sufficiently exert a proper light condensing effect and realize a low-height LED device.

As the distance between adjacent cups can be made to be shorter as compared with the related art, it is possible to downsize the LED device and contribute to downsizing the instrument that includes the LED device mounted thereon.

Similarly, as the distance between adjacent cups can be shortened, even if LED chips having different light source colors are mounted, light emitted from the LED chips can be mixed well. This is advantageous to provide an LED device that is excellent in color mixture characteristics.

As discussed above, a cavity 8 can be provided around the cups that receive the LED chips, and the cavity can have an inner circumferential surface 7 that is an inclined surface relative to the optical axis of the LED chip and that is open toward the direction of light emitted from the LED chip. As a result, light traveling toward the inclined inner circumferential surface of the cavity is reflected therefrom toward the lenses on the light exit surface. This allows the light emitted from the LED chips to be externally emitted efficiently to provide a bright LED device with high efficiency of light extraction.

The shape of the convex lens formed above the LED chip can be controlled to freely set the degree of condensing for the light emitted from the exit surface of the lens. This means that the distribution of light emitted from the LED device can be controlled freely.

The outer wall defining the cup can be formed on molding. Therefore, application of a process to the mold makes it possible to freely set the shape of the cup without any constraint. Therefore, the flexibility in determination of the light distribution by the shape of the cup is large, and the distribution of light emitted from the LED chip and reaching the convex lens can be realized in an ideal form.

As a result, it is possible to easily realize an optimal light distribution in consideration of conditions and environments for the use of the LED device, such as the distance and direction associated with observation of the LED device and the shape and size of an object illuminated from the LED device.

As described above, the LED device including plural LED chips having different light source colors used as light sources as described above with respect to FIGS. 1 and 5 can satisfy the requirements for both illumination and display and is applicable to wider fields of applications.

Therefore, the LED device can be utilized in wide fields. For example, in the field of consumer instruments, it can be utilized as: a back light source in LCD panels for use as display devices in relatively small instruments such as cell phones, digital cameras, digital video cameras and PDAs; a flash light source in mobile instruments such as cell phones; a light source for various information display boards; and a light source for various indicators. Also in the field of vehicular instruments, it can be utilized as a back light source in LCD panels for use as display devices in vehicular instruments, and a light source for various indicators, etc.

While there has been described what are at present considered to be preferred and exemplary embodiments of the invention, it will be understood that various modifications may be made thereto, and it is intended that the appended claims cover all such modifications as fall within the true spirit and scope of the invention.

What is claimed is:

1. An LED device, comprising:
   a reflector made of a particular material, the reflector including
       a cavity formed in the reflector,
       a plurality of cups formed in the cavity, and each having an outer wall integral with the reflector and a bottom, molded integrally with the reflector, and
       a lead frame located adjacent the cavity and made of a material different from the particular material;
   a plurality of LED chips, at least one of the plurality of LED chips located in at least one of the plurality of cups; and
   a light transmissive resin located in the cavity to seal the at least one of the plurality of LED chips and the at least one of the plurality of cups.

2. The LED device according to claim 1, wherein the at least one of the plurality of cups is shaped substantially cylindrical.

3. The LED device according to claim 2, wherein the particular material includes a white resin having a high reflectivity.

4. The LED device according to claim 2, wherein the LED chips include a combination of LED chips of two or more types having different light source colors.

5. The LED device according to claim 2, further comprising:
   convex lenses, wherein the plurality of LED chips each have an optical axis, and each of the convex lenses is located above a respective one of the LED chips, and each of the convex lenses has an optical axis that is substantially coincident with the optical axis of the respective one of the LED chips.

6. The LED device according to claim 1, wherein the particular material includes a white resin having a high reflectivity.

7. The LED device according to claim 6, wherein the LED chips include a combination of LED chips of two or more types having different light source colors.

8. The LED device according to claim 6, further comprising:
   convex lenses, wherein the plurality of LED chips each have an optical axis, and each of the convex lenses is located above a respective one of the LED chips, and each of the convex lenses has an optical axis that is substantially coincident with the optical axis of the respective one of the LED chips.

9. The LED device according to claim 1, wherein the LED chips include a combination of LED chips of two or more types having different light source colors.

10. The LED device according to claim 9, further comprising:
    convex lenses, wherein the plurality of LED chips each have an optical axis, and each of the convex lenses is located above a respective one of the LED chips, and each of the convex lenses has an optical axis that is substantially coincident with the optical axis of the respective one of the LED chips.

11. The LED device according to claim 1, further comprising:
    convex lenses, wherein the plurality of LED chips each have an optical axis, and each of the convex lenses is located above a respective one of the LED chips, and each of the convex lenses has an optical axis that is substantially coincident with the optical axis of the respective one of the LED chips.

12. The LED device according to claim 1, wherein the reflector is molded from a resinous material.

13. The LED device according to claim 1, wherein the particular material is a resinous material.

14. The LED device according to claim 1, wherein the cups are located within the cavity.

15. The LED device according to claim 1, wherein the lead frame is insert-molded with the cavity.

16. The LED device according to claim 1, wherein the outer wall of the at least one of the plurality of cups is made of the particular material.

17. The LED device according to claim 1, wherein the reflector has an inner circumferential surface that is open wider at an upward location.

18. An LED device, comprising:
    a reflector body made of a first material, the reflector body including a cavity and having a light emitting direction;
    a plurality of cups formed in the cavity of the reflector body, and each having an outer wall integral with the reflector body and a bottom, molded integrally with the reflector, and made of the first material;
    a lead frame located adjacent the cavity and made of a material different from the first material and extending continuously in a single plane from a first end of the cavity to a diametrically opposed second end of the cavity;
    a plurality of LED chips, at least one of the plurality of LED chips located in at least one of the plurality of cups and located, with respect to the light emitting direction, above the single plane formed by the lead frame; and
    a light transmissive resin located in the cavity to seal the at least one of the plurality of LED chips and the at least one of the plurality of cups in the cavity.

19. The LED device according to claim 18, wherein the at least one of the plurality of cups is shaped substantially cylindrical.

20. The LED device according to claim 18, wherein the reflector body is made of the first material, and the first material includes a white resin having a high reflectivity.

21. An LED device, comprising:
    a reflector body made of a first material, the reflector body including a cavity and having a light emitting direction;
    a plurality of cups formed in the cavity of the reflector body, and each having an outer wall integral with the reflector body and a bottom, molded integrally with the reflector body, and made of the first material;
    a lead frame located adjacent the cavity and made of a material different from the first material;
    a plurality of LED chips each having a bottom surface and a top surface separated by a side surface, the bottom surface being connected to the lead frame, and at least one of the plurality of LED chips being located in at least one of the plurality of cups; and
    a light transmissive resin located in the cavity to seal the at least one of the plurality of LED chips and the at least one of the plurality of cups in the cavity such that the resin extends continuously and linearly from the side surface of the at least one of the LED chips to the at least one of the cups.

22. The LED device according to claim 21, wherein the at least one of the plurality of cups is shaped substantially cylindrical and the first material includes a white resin having a high reflectivity.

* * * * *